United States Patent [19]

Rodder

[11] Patent Number: 6,087,248
[45] Date of Patent: Jul. 11, 2000

[54] METHOD OF FORMING A TRANSISTOR HAVING THIN DOPED SEMICONDUCTOR GATE

[75] Inventor: Mark Stephen Rodder, University Park, Tex.

[73] Assignee: Texas Instruments Incorporated, Dallas, Tex.

[21] Appl. No.: 09/225,878

[22] Filed: Jan. 5, 1999

Related U.S. Application Data

[60] Provisional application No. 60/070,449, Jan. 5, 1998.

[51] Int. Cl.$^7$ .................................................. H01L 21/3205
[52] U.S. Cl. ........................ 438/561; 438/561; 438/563; 438/564; 438/592
[58] Field of Search ..................................... 438/563, 564, 438/592, 561, FOR 193, 585

[56] References Cited

U.S. PATENT DOCUMENTS

| | | |
|---|---|---|
| 5,281,552 | 1/1994 | King et al. . |
| 5,541,121 | 7/1996 | Johnson . |
| 5,798,295 | 8/1998 | Hoover et al. . |
| 5,837,601 | 11/1998 | Matsumoto . |
| 5,856,225 | 1/1999 | Lee et al. . |

*Primary Examiner*—George Fourson
*Assistant Examiner*—Joannie A. Garcia
*Attorney, Agent, or Firm*—Jacqueline J. Garner; W. James Brady, III; Frederick J. Telecky, Jr.

[57] ABSTRACT

A method of forming a transistor is disclosed that comprises the step forming a gate insulator layer 12 on an outer surface of the substrate 10. A first gate conductor layer 22 is formed outwardly from the gate insulator layer 12. The first gate conductor layer 22 is extremely thin. Dopants are introduced into the layer 22 to render it conductive by using a diffusion source layer 24. The diffusion source layer 24 is then removed and replaced by a second gate conductor layer 26 having low resistance. The layer 26 can be used to form a T-gate structure 28, a flush gate 30, or a conventional gate structure.

15 Claims, 2 Drawing Sheets

METHOD OF FORMING A TRANSISTOR HAVING THIN DOPED SEMICONDUCTOR GATE

This application claims priority under 35 USC § 119 (e) (1) of provisional application No. 60/070,449 filed Jan. 5, 1998.

TECHNICAL FIELD OF THE INVENTION

This invention relates in general to the field of electronic devices, and more particularly, to an improved transistor architecture having a thin semiconductor control gate that is doped using a diffusion source layer and a method of forming such a device.

BACKGROUND OF THE INVENTION

Integrated circuit device designers constantly strive to create active devices such as transistors that are as small as possible. One of the chief limiting dimensions in a transistor design is the size of the control gate of the device. A variety of techniques have been used to reduce the size of the control gate of a transistor including the use of disposable gate production techniques. These techniques have been successful in reducing the lateral dimension of a control gate of a transistor to 500 Angstroms or less.

With a decrease in the lateral dimension of a transistor, the overall amount of material in the control gate is correspondingly decreased. This results in a reduction of the ability of the control gate to carry current. This problem cannot be addressed directly by solely using lower resistance materials in the control gate because the threshold voltage of the device is directly related to the work function of the material used in the gate of the device. For example, in the context of silicon-based CMOS applications, it is advantageous for the overall function of the device to have polysilicon or other silicon materials in the control gate of the device adjacent the gate insulator of the device.

SUMMARY OF THE INVENTION

Accordingly, a need has arisen for a transistor architecture that provides for the use of one type of material in the control gate to yield the desired threshold voltage of the device but allows for the use of other lower resistance materials to provide for higher current carrying capability for the control gate as a whole.

In accordance with the teachings of the present invention, a transistor architecture and method of formation are provided that substantially reduce or eliminate problems associated with prior techniques and devices.

According to one embodiment of the present invention, a method of forming a transistor on a semiconductor substrate is provided that comprises the steps of forming a gate insulator layer on an outer surface of the semiconductor substrate. A thin first gate conductor layer is then formed outwardly from the gate insulator layer. The gate conductor layer may comprise, for example, in the context of silicon-based CMOS applications, a polysilicon layer or a non-crystalline silicon layer. A diffusion source layer is then deposited outwardly from the first gate conductor layer. In silicon-based CMOS applications, the diffusion source layer may comprise, for example, silicon germanium, borosilicate glass or phosphosilicate glass. The diffusion layer is doped with impurities. The structure is then annealed to allow the impurities to diffuse from the diffusion layer into the first gate conductor layer. The diffusion layer is then removed. A second gate conductor layer is then deposited outwardly from the first gate conductor layer. The second gate conductor layer may comprise, for example, a metal material or any other suitable material having low resistance.

An important technical advantage of the present invention inheres in the fact that the method of the present invention provides for the use of a thin first gate conductor layer that is doped using a diffusion source layer. A second gate conductor layer can then be placed outwardly from the first gate conductor layer. As such, the integrated gate structure includes a low resistance portion and an underlying conductor portion that enhances or controls the threshold voltage of the overall device.

BRIEF DESCRIPTION OF THE DRAWINGS

A more complete understanding of the teachings of the present invention and the advantages thereof may be acquired by referring to the accompanying figures in which like reference numbers indicate like features and wherein.

DETAILED DESCRIPTION OF THE INVENTION

Figure 1A:
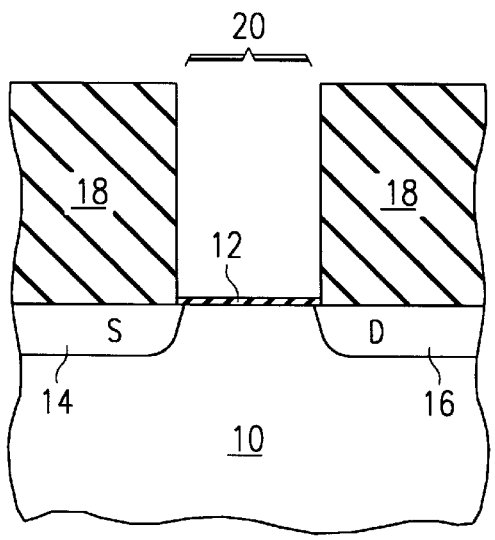
FIGS. 1A–1F are greatly enlarged cross-sectional elevational schematic diagrams illustrating a method of constructing a transistor according to the teachings of the present invention.

FIG. 1A illustrates an initial semiconductor structure formed on an outer surface of a semiconductor substrate 10. Semiconductor substrate 10 may comprise, for example, a wafer or layer of single crystalline silicon or other suitable semiconductor material. A gate insulator layer 12 is formed on a portion of the outer surface of substrate 10 as shown. A source region 14 and a drain region 16 are spaced apart in the outer surface of substrate 10 on opposite sides of gate insulator layer 12. Source and drain regions 14 and 16 may comprise regions of the outer surface of semiconductor of substrate 10 that have been doped with a sufficient concentration of impurities to render the regions 14 and 16 conductive. Insulator layer 12 may comprise a dielectric layer on the order of 20 to 50 Angstroms in thickness. Gate insulator layer 12 may comprise silicon dioxide, silicon nitride, combinations of layers of oxide and nitride materials, nitrided oxides or other suitable dielectrics. Gate insulator 12 is formed at an opening 20 of a primary insulation layer 18. Primary insulation layer 18 may comprise, for example, a layer of oxide which is deposited using low pressure chemical vapor deposition. Layer 18 may be on the order of 1500 to 2500 Angstroms in thickness.

The structure shown in FIG. 1A is constructed using conventional disposable gate techniques. For example, an initial disposable gate body (not shown) is formed on the outer surface of substrate 10. Source and drain regions 14 and 16 are formed by means well known in the art for fabrication of conventional MOSFET structures. Layer 18 is then deposited around and over the initial disposable gate body. The entire structure can then be planarized using chemical-mechanical polishing techniques to expose the outer surface of the disposable gate body. The disposable gate body can then be removed to leave opening 20 in layer 18. Gate insulator 12 can then be grown, or alternatively, deposited and conformed to layer 18, within opening 20.

Figure 1B:
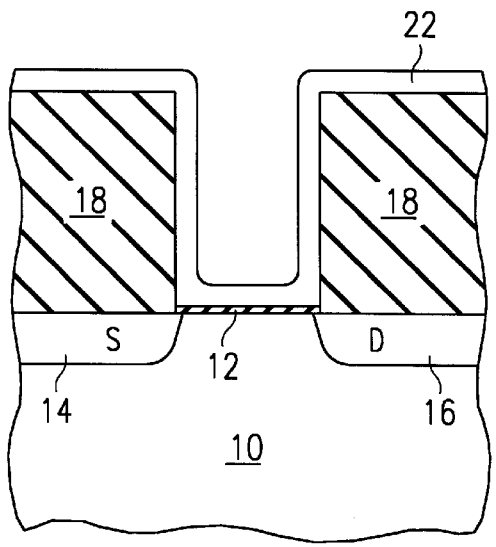

Referring to FIG. 1B, a thin gate conductor layer 22 is deposited covering the outer surfaces of primary insulation layer 18 and gate insulator layer 12. Gate conductor layer 22 may comprise, for example, in the context of silicon-based CMOS applications, a polysilicon or non-crystalline silicon layer. Gate conductor layer 22 may be on the order of 50 to 250 Angstroms in thickness. In silicon-based CMOS applications, it is beneficial to have a polysilicon or non-crystalline silicon layer in contact with the gate insulator layer 12 because the work function of silicon will influence the threshold voltage of the eventual device. However, it is difficult to implant dopants into layer 22 after it is deposited because the dopants will pass through layer 22 because of its thinness. In addition, the aspect ratio of opening 20 makes it difficult to implant the bottom portion of layer 22 near the insulator layer 12 and the side portions of layer 22 on the opposing sidewalls of layer 18 within opening 20. Eventually, the remainder of opening 20 will be filled with a second gate conductor to provide for an extremely low resistance integrated gate structure. In order to have as much material as possible for the second gate conductor, it is beneficial to have layer 22 as thin as possible. However, the thinness of layer 22 makes it difficult to implant dopants into layer 22 to render it conductive.

Figure 1C:
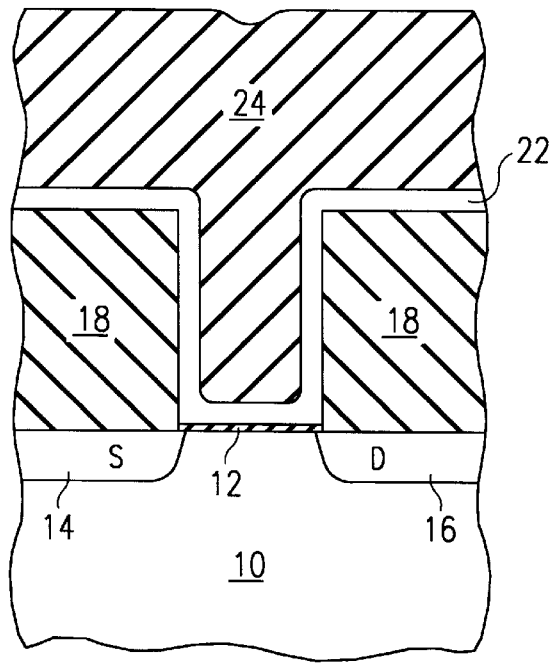

Referring to FIG. 1C, according to the teachings of the present invention, a diffusion source layer 24 is deposited outwardly from gate conductor layer 22. Diffusion source layer 24 may comprise, for example, in silicon-based CMOS applications, silicon germanium, borosilicate glass or phosphosilicate glass. Layer 24 may be on the order of 500–2000 Angstroms in thickness. If silicon germanium is used for layer 24, the deposition of layer 24 may proceed using on the order of 30–70% of germanium. This mixture will provide for a highly polycrystalline material. This will provide for a large number of grain boundaries within layer 24 to provide diffusion paths for dopants through layer 24. If silicon germanium is used as the material within layer 24, layer 24 can be used as a diffusion source for either p-type or n-type impurities. For areas of an integrated circuit requiring p-type gates, layer 24 can be implanted with boron at an energy of 1–15 KeV at a dose of 2–10 E15 ions/cm$^2$ and at implant angles from 0–45 degrees. Other species such as boron difluoride could be implanted with an appropriate change in energy. In areas of an integrated device that require n-type gates, the silicon germanium within layer 24 can be implanted with phosphorous ions at an energy of 10–50 KeV at a dose of 2–10 E15 ions/cm$^2$ and at implant angles of 0–45 degrees. Other species such as arsenic could be implanted with an appropriate change in energy.

Alternatively, borosilicate glass (BSG) can be used in areas requiring p-type gates and phosphosilicate glass (PSG) can be used in areas requiring n-type gates. An advantage of using silicon germanium in this context is that a single layer of silicon germanium can be implanted in two successive steps with n-type and p-type dopants. These two implantation steps can then be followed by a single anneal process to diffuse the dopants into the gate conductor layer 22. Alternatively, a first anneal can be used to diffuse a first implant and a second anneal can be used to diffuse a second implant. If BSG or PSG is used, separate deposition, masking or patterning steps, and anneal processes will be required for the formation of p-type and n-type gates on an integrated device.

After the diffusion source layer 24 has been doped by means of in situ doping or by means such as implantation with the appropriate species of impurities, the entire structure is annealed to allow the impurities within diffusion source layer 24 to diffuse into and render conductive gate conductor layer 22. Alternatively, a first anneal can be used to diffuse a first implant and a second anneal can be used to diffuse a second implant. This anneal process may comprise, for example, a rapid thermal anneal process lasting on the order of 5–30 seconds at a temperature of between 950° C. and 1050° C.

Following the anneal process, the diffusion source layer 24 can be removed using conventional etch processes. In silicon-based applications, conventional etch processes may be used which are selective to oxide, non-crystalline silicon or polysilicon relative to silicon germanium.

In one embodiment of the present invention, a silicon germanium (SiGe) diffusion source layer may be deposited by using low-pressure chemical vapor deposition (LPCVD) or rapid thermal chemical vapor deposition (RTCVD). SiGe content will typically be from 30–75%. The lower percentage ensures a greater than 20:1 selectivity during selective etch of SiGe to silicon (Si). The upper limit is set by annealing constraints. At 75% SiGe, the film will begin to melt at approximately 1000° C. and, thus, furnace annealing would be required for drive in of dopants.

To etch the selective to Si, a 1:1:5 NH$_4$OH:H$_2$O$_2$:H$_2$O solution may be used. Standard temperatures of 45–85° C. may be used. Lower temperatures have slightly better selectivity but the etch rates are lower. H$_2$O dilution has no impact on selectivity, 1:1:5 has the highest etch rate. For example, 40% germanium results in 36:1 SiGe:Si etching selectivity while 55% Ge results in 177:1 SiGe:Si etching selectivity.

Figure 1D:
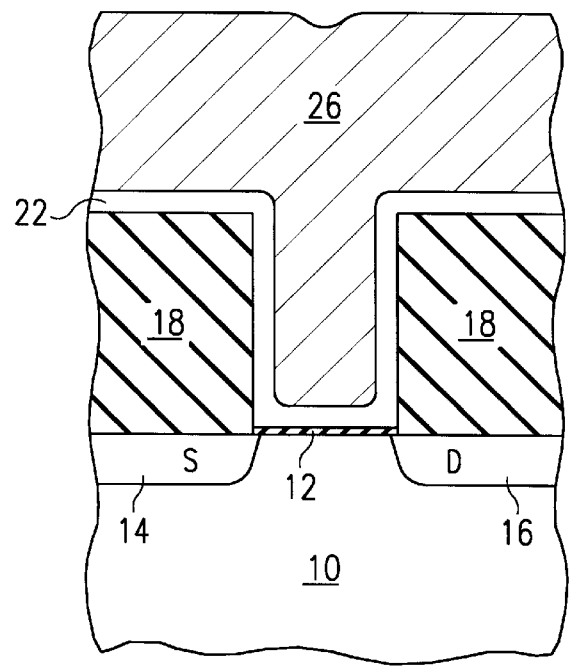

Referring to FIG. 1D, a second gate conductor layer 26 is then deposited outwardly from the doped gate conductor layer 22. Gate conductor layer 26 may comprise, for example, aluminum, tungsten, platinum, copper, combinations of metals with titanium nitride, or any other suitable material having low resistance. If later processes on the integrated device require high temperatures, layer 26 should comprise a refractory metal such as tungsten that can withstand the later high temperature processes.

Figure 1E:
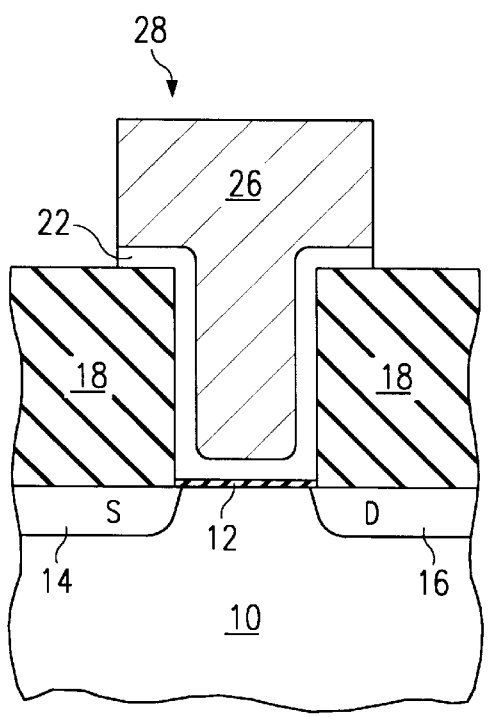
Figure 1F:
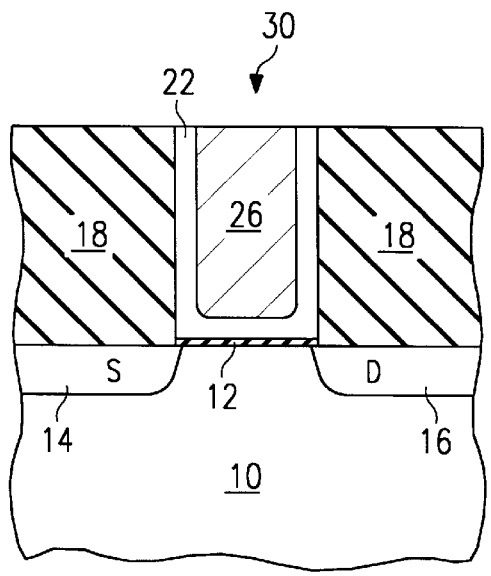

After the deposition of layer 26, photolithographic processes can be used to form a T-gate 28 as shown in FIG. 1E. The T-gate 28 can be formed through conventional plasma assisted reactive ion etching. Alternatively, layer 26 can be subjected to a chemical-mechanical polish process to form a flush gate 30 as shown in FIG. 1F. Both T-gate structure 28 and flush gate structure 30 enjoy the benefits of having a first gate conductor layer 22 that is doped so as to be rendered conductive in contact with the gate insulator layer 12 so that the threshold voltage of the integrated device benefits from the work function of the first conductor layer 22 material. Gates 28 and 30 also include a large amount of highly conductive material that reduces the overall resistance of the gate structures 28 and 30. In this manner, extremely small gate conductors can be formed that will still maintain adequate conductance.

Figure 2A:
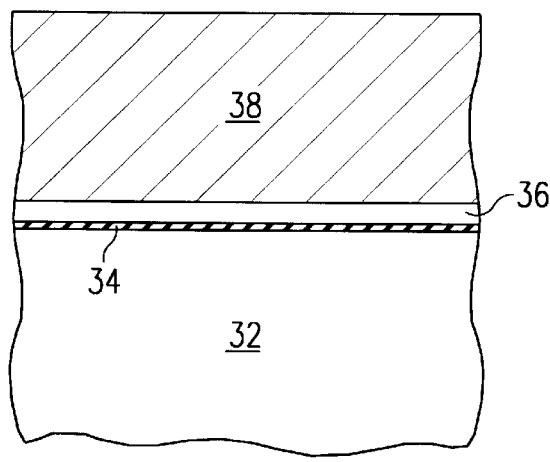
FIGS. 2A and 2B are greatly enlarged cross-sectional elevational schematic diagrams illustrating an alternate method of forming a transistor according to the teachings of the present invention.

FIGS. 1A–1F illustrated the application of the present invention to a disposable gate process. The present invention can be applied with equal effectiveness to the formation of a device where the gate conductor is defined using conventional photolithographic processes. Referring to FIG. 2A, a semiconductor substrate 32 is provided that may comprise, for example, a wafer or layer of single-crystalline silicon or other suitable semiconductor material. A gate insulator layer 34 is grown or deposited on the outer surface of substrate 32. Gate insulator layer 34 may comprise, for example, on the order of 20–50 Angstroms of silicon dioxide or other suitable insulator. A gate conductor layer 36 is deposited outwardly from gate insulator layer 34. In the context of silicon-based CMOS applications, layer 36 may comprise on the order of 150–1000 Angstroms of polysilicon or non-crystalline silicon, although values of 600–800 Angstroms may be typical. A diffusion source layer 38 is then deposited outwardly from gate conductor layer 36. Diffusion source layer 38 may be constructed identically as diffusion source layer 24 discussed with reference to FIG. 1 previously. It may comprise, for example, a layer of silicon germanium on the order of 2000 Angstroms thick. Layer 38 may be doped using n-type dopants or p-type dopants as discussed with reference to FIG. 1 previously. The structure can then be subjected to anneal process as discussed previously to allow these dopants to diffuse from layer 38 and into layer 36 so as to render layer 36 conductive.

Figure 2B:
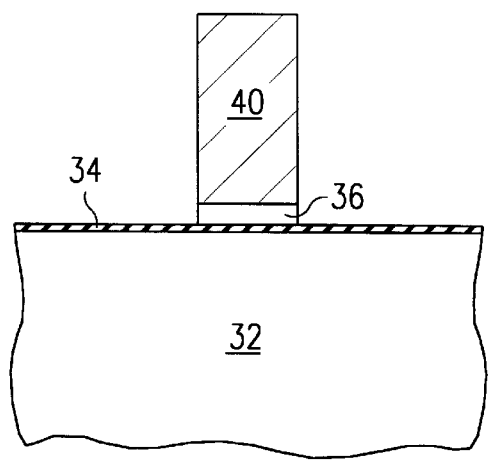

Referring to FIG. 2B, layer 38 is removed using conventional etch processes and a second gate conductor layer 40 is deposited outwardly from gate conductor layer 36. Gate conductor layer 40 may comprise aluminum, platinum, tungsten, copper, combinations of metals with titanium nitride, or any other suitable material having low resistance. As discussed previously, if later high temperature processes are required, layer 40 should comprise a metal such as tungsten that can withstand the later high temperature processes. Following the deposition of layer 40, the combination of gate conductor layer 40 and gate conductor 36 can be patterned and etched to form the integrated gate stack shown in FIG. 2B using conventional photolithographic and etching processes. Conventional steps can then be used to form source and drain regions and contacts for the regions of a transistor. Accordingly, the teaching of the present invention in providing a diffusion source layer can be applied to disposable gate processes as well as processes that utilize conventional photolithographic masking and etching to define the gate boundaries.

Although the present invention has been described in detail, it should be understood that various changes, alterations, substitutions, and modifications may be made to the teachings contained herein without departing from the spirit and scope of the present invention which is solely defined by the appending claims.

What is claimed is:

1. A method of forming a transistor at the outer surface of a semiconductor layer, comprising the steps of:

forming a gate insulator layer on the outer surface of the semiconductor layer;

forming a first gate conductor layer having a thickness in the range of 50 to 250 Å outwardly from the gate insulator layer and separated from the semiconductor layer by the gate insulator layer;

forming a doped diffusion source layer adjacent to and outwardly from the first gate conductor layer;

annealing the diffusion source layer and the first gate conductor layer to allow the dopants to diffuse from the diffusion source layer into the first gate conductor layer;

removing the diffusion source layer; and forming a second gate conductor layer adjacent to and outwardly from the first gate conductor layer.

2. The method of claim 1 wherein the diffusion source layer comprises silicon germanium.

3. The method of claim 1 wherein the diffusion source layer comprises borosilicate glass.

4. The method of claim 1 wherein the diffusion source layer comprises phosphosilicate glass.

5. The method of claim 1 wherein the step of doping the diffusion source layer comprises the step of implanting boron into a diffusion source layer comprising silicon germanium.

6. The method of claim 1 wherein the step of doping the diffusion source layer comprises the step of implanting phosphorous into a diffusion source layer comprising silicon germanium.

7. The method of claim 1 and further comprising the step of forming a primary insulation layer on the outer surface of the semiconductor layer, the primary insulation layer defining an opening in which the gate insulator layer, the first gate conductor layer, and the second gate conductor layer are formed.

8. The method of claim 1 wherein the step of forming a diffusion source layer comprises the step of depositing a layer of silicon germanium having a percentage of germanium in the range of about 30% to about 75%.

9. The method of claim 1 wherein the first gate conductor layer comprises silicon.

10. The method of claim 1 wherein the second gate conductor layer comprises metal.

11. A method of forming an integrated circuit, comprising the steps of:

forming a source region and a drain region in a semiconductor layer;

forming a primary insulation layer on a surface of said semiconductor layer, said primary insulation layer defining an opening;

forming a gate insulator layer on the surface of said semiconductor layer within said opening;

forming a gate electrode in said opening comprising the steps of:

forming a conductive liner comprising silicon over said primary insulator layer and said gate insulator including on sidewalls of said primary insulator layer within said opening;

forming a doped diffusion source layer over said conductive liner layer including within said opening;

annealing the doped diffusion source layer and the conductive liner layer to allow the dopants to diffuse from the doped diffusion source layer to the conductive liner layer;

removing the doped diffusion source layer;

forming a gate conductor layer on said conductive liner layer.

12. The method of claim 11, further comprising the step of removing said gate conductor layer and said conductive liner layer from over said primary insulator layer.

13. The method of claim 11, further comprising the step of patterning and etching said gate conductor layer and said conductive liner layer to form said gate electrode.

14. The method of claim 11, wherein said conductive liner layer comprises polysilicon.

15. The method of claim 11, wherein said gate conductor layer comprises metal.

* * * * *